(12) United States Patent
Johnson

(10) Patent No.: US 6,339,206 B1
(45) Date of Patent: Jan. 15, 2002

(54) APPARATUS AND METHOD FOR ADJUSTING DENSITY DISTRIBUTION OF A PLASMA

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/509,549
(22) PCT Filed: Oct. 15, 1998
(86) PCT No.: PCT/US98/21622
  § 371 Date: May 9, 2000
  § 102(e) Date: May 9, 2000
(87) PCT Pub. No.: WO99/19526
  PCT Pub. Date: Apr. 22, 1999

Related U.S. Application Data

(60) Provisional application No. 60/061,856, filed on Oct. 15, 1997.

(51) Int. Cl.[7] .................................................. B23K 9/00
(52) U.S. Cl. ........................... 219/121.43; 219/121.48; 219/121.4; 156/345; 118/723 I
(58) Field of Search ........................ 219/121.4, 121.41, 219/121.44, 121.43; 156/345, 643.1, 646.1; 118/723 I, 723 R, 723 MW, 715; 204/298.37, 298.38, 298.21

(56) References Cited

U.S. PATENT DOCUMENTS

| | | | |
|---|---|---|---|
| 4,828,369 A | 5/1989 | Hotomi | |
| 5,279,669 A | 1/1994 | Lee | |
| 5,580,420 A | * 12/1996 | Watanabe et al. | 156/643.1 |
| 5,605,599 A | 2/1997 | Benzing et al. | |
| 5,777,289 A | * 7/1998 | Hanawa et al. | 219/121.43 |
| 5,811,022 A | 9/1998 | Savas et al. | |
| 5,824,607 A | 10/1998 | Trow et al. | |
| 6,019,848 A | * 2/2000 | Frankel et al. | 118/715 |
| 6,156,164 A | * 12/2000 | Smolanoff et al. | 204/192.12 |

* cited by examiner

Primary Examiner—Mark Paschall
(74) Attorney, Agent, or Firm—Oblon, Spivak, McClelland, Maier & Neustadt, P.C.

(57) ABSTRACT

An apparatus and method for adjusting a distribution of a density of a plasma and/or a distribution of a chemical composition of a plasma, thereby adjusting the characteristics of a reaction used to process a substrate. The distribution of the density and/or the chemical composition are controlled by adjusting the geometry of recombination surfaces that are in contact with the plasma and which thereby stimulate the recombination of ions and electrons in particular regions of the plasma. For example, a recombination member (502) having a predetermined geometry can be provided in order to adjust the plasma density and chemistry in one or more local regions. In addition, plasma density can be adjusted by providing a conductive shield (1002) to reduce the coupling of RF power to particular regions of the plasma, thereby reducing plasma density in these regions. By adjusting the distribution of the density and chemical composition of a plasma, uniformity of a plasma processes (e.g., etching processes or plasma-enhanced chemical vapor deposition processes), is improved, resulting in improved uniformity of electrical properties of devices (106) being fabricated, improved critical dimension, and, consequently, improved performance and reduced costs of circuits fabricated on a substrate.

66 Claims, 12 Drawing Sheets

APPARATUS AND METHOD FOR ADJUSTING DENSITY DISTRIBUTION OF A PLASMA

CROSS-REFERENCE TO CO-PENDING APPLICATION

The present application is related to and claims priority to U.S. Provisional Application Ser. No. 60/061,856, filed Oct. 15, 1997. The contents of that provisional application are incorporated herein by reference.

BACKGROUND OF THE INVENTION

1. Field of the Invention

The invention relates to systems for adjusting spatial plasma densities/distributions and spatial distributions of chemicals within a plasma, and particularly to systems which use a plasma to process a substrate.

2. Discussion of the Background

In many electrical device and solid state manufacturing processes, a plasma reacts, or facilitates a reaction, with a substrate, such as a semiconductor wafer. In order to generate the plasma, power is supplied to a gas by an inductive or a capacitive plasma coupling element. Examples of inductive coupling elements include conductive and helical coils. Many conventional systems supply the RF power through an electrical matching network (MN). One known inductive plasma generating system is disclosed in U.S. pat. No. 5,234,529, issued to Wayne L. Johnson, the inventor of the present application. The contents of that patent are incorporated herein by reference.

One method of generating a plasma source 114 is described with reference to FIG. 1. A gas is supplied to a process chamber 102 through gas inlets 112. An RF power source 110 having an output impedance $R_s$ supplies RF power to a helical coil 104 acting as an inductive coupling element. The coil 104 couples energy into the gas and excites it into a plasma within a plasma region 108 of the process chamber 102. The plasma and energetic and/or reactive particles produced by the plasma (e.g., ions, atom, or molecules), can then be released through an output 120 of the plasma source 114 and used to process a substrate, e.g., a semiconductor wafer 106 or a flat panel display substrate.

During plasma processing, one factor controlling how processing occurs is "ambipolar diffusion." The ambipolar diffusion process is illustrated in FIG. 2, which portrays a recombination surface 1306 to which electrons 1302 of the plasma are attracted. Upon reaching the recombination surface 1306, the electrons 1302 adhere thereto, thereby producing a net negative charge which attracts ions 1304 from the plasma. The ions 1304, upon reaching the recombination surface 1306, recombine with electrons 1302 to produce neutral particles 1308. This recombination lowers the ion density $n_p$ in the plasma since neutral particles 1308 do not contribute to the ion density $n_p$. More importantly, the plasma density is reduced adjacent to the recombination surface 1306 as compared to further away from the surface 1306. Consequently, the geometry of the walls acting as recombination surfaces affects the spatial distribution of a plasma within the source. In addition, since some ion species are more susceptible to this recombination process than other species, a recombination surface can cause one or more of the ion species to recombine disproportionately, thereby affecting the chemical composition of the plasma.

The ion density $n_p$ of the plasma in a particular region is also affected by the rates of several processes, including (1) the rate of production of ion-electron pairs, (2) the rate of recombination of ion-electron pairs, and (3) the rate of flow of electrons and ions into or out of the region (including pumping). The local plasma density $n_p$ in the region at a particular time is the value at which the aforementioned process rates are at an equilibrium. The value of $n_p$ also can be affected by the amount of power supplied to the region. More specifically, an increased amount of power supplied to the region tends to increase the local rate of production of ion-electron pairs, thereby increasing the value of $n_p$ in the region.

Non-uniform spatial distribution of the density of the plasma across the output 120 of the source 114 is disadvantageous. As shown in the graph of FIG. 3A, the local plasma density $n_p$ at a given location x across the output of a source can depend on the location, as well as the average plasma density $<n_p>$ of the source. The graph includes curves representing $n_p$ vs. x for two different plasmas, each having its own value of average density $<n_p>$. For both plasmas of this example, $n_p$ is at a maximum in the center 320 of the source (and, therefore, in the center of the wafer 106) and is smaller at the edges 322. Further, this non-uniformity of $n_p$ is more pronounced when the average density is higher (high $<n_0>$) than it is when the average density is lower (low $<n_p>$).

As described above, the ion density $n_p$ also varies spatially based on the geometry of the source. FIG. 3B is a graph of local ion density $n_p$ as a function of location x for sources varying effective with and effective length L. As illustrated in the graph, the uniformity of plasma density can depend on the aspect ratio (L/W) of the plasma source. For examply, the ion density $n_p$ of each of the long and medium sources is greatest in the center 320 of the source and smallest at the edges of 322 whereas, for the short source, $n_p$ exhibits a relative dip near the center 320. The relative peak in plasma density near the center (and the relatively low plasma density near the edges 322) of a long source, can be caused by the proximity of a side wall 124 to the edge of the source. The side wall provides a recombination surface which increases the rate of recombination of ions and electrons. As a result, the plasma density can be reduced near the edges of a long source.

When processing a substrate, particularly a semiconductor water, non-uniformity of plasma density can cause non-uniformity of reaction characteristics (e.g., reaction rates) across the surface of the substrate. For example, as illustrated in FIG. 3C, if a plasma is used to etch a film on a substrate, and the plasma has a higher density near the center 320 of the wafer 106, the etching rate can be higher in the center of the wafer 106 and lower at the edges 322. Similarly to the example of FIG. 3A, the process of FIG. 3C can exhibit more pronounced non-uniformity in cases of high $<n_p>$ and less pronounced non-uniformity in cases of low $<n_p>$.

The problems of non-uniformity of plasmo densities are discussed in severs U.S. patents which are incorporated herein by reference. Those patents are: U.S. Pat. No. 4,340,461 to Hendricks et al., entitled "Modified RIE Chamber for Uniform Silicon Etching"; U.S. Pat. No. 4,971,651 to Wantabe, entitled "Microwave Plasma Processing Method and Apparatus" in which local plasma density is absorbed, attenuated or diffused to produce a uniform plasma density, thereby uniformly processing a wafer; U.S. Pat. No. 5,444,207 to Sekine et al., entitled "Plasma Generating Device and Surface Processing Device and Method for Processing Wafers in a Uniform Magnetic Field"; U.S. Pat. No. 5,534,108 to Qian et al., entitled "Method and Apparatus for Altering Magnetic Coil Current to Produce Etch Uniformity in a Magnetic Field-Enhanced Plasma Reactor" in which a uniform plasma density is produced by a magnetic field rotating in a plane parallel to a horizontal plane of a processed substrate; U.S. Pat. No. 5,589,737 to Barnes et al., entitled "Plasma Processor for Large Workpieces" in which uneven processing is described as a result of non-uniform plasma density over large workpieces such as rectangular flat panel displays; and U.S. Pat. No. 5,593,539 to Kubota et al., entitled "Plasma Source for Etching" in which electrons are moved in a cycloid motion in order to produce a uniform plasma density.

Improvements in the performance of parallel plasma processors have been made by changing one or more electrodes in various ways. Gorin and Hoog (U.S. Pat. No. 4,209,357) describe increased uniformity of etching using different sized electrodes with adjustable spacing. Adjustable spacing has also been considered by Koch (U.S. Pat. No. 4,340,462). Hendricks et al. (U.S. Pat. No. 4,340,461) describe using a baffle plate to increase the size of the powered electrode. Non-planar electrodes of various shapes have been asserted to be beneficial. Some are simply curved (see Mundt et al. (U.S. Pat. No. 4,297,162) and Mallon (U.S. Pat. No. 5,628,869)); other have more complicated surfaces which may include projections of various shapes (see Zajac (U.S. Pat. Nos. 4,307,283 and 4,342,901) and Salimian et al. (U.S. Pat. No. 5,716,485)). Additionally, known systems achieve a uniform dense plasma using hollow cathodes distributed over the electrode surface while others achieve greater uniformity by selectively spacing wafers from the cathode by using quartz spacers. Electrodes with independently adjustable segments have been proposed. The several segments may be excited by separate RF sources as well. See Susko (U.S. Pat. No. 4,885,074).

Zajac (U.S. Pat. No. 4,307,283), discussed above, also discusses gas flow dynamics in conjunction with electrode shape. A cap with distributed apertures for gas flow and a concave surface facing a wafer to be processed reduces power density at the center of the wafer and, therefore, provides more uniform etching. See Sharp-Geisler (U.S. Pat. No. 4,612,432).

The principal way in which plasma uniformity has been addressed in inductively coupled plasma (ICP) generators is via the excitation coil(s). Varnes et al. U.S. Pat. No. 5,589,737) describes planar coils of relatively complex designs that avoid current and phases non-uniformity associated with coils for which the length exceeds ⅛ wavelength. It is known that coil geometry can cause changes in electron densities. Hook et al. (U.S. Pat. No. 5,648,701) describe coils for use in plasmas at high pressures (>5 Pa or about 40 mTorr).

An ICP reactor with a plurality of separate concentric channels, each with its own process gas controller and shielded independently powered RF coil, provides improved control of plasma density. See Hartig and Arnold (U.S. Pat. No. 5,683,548). Johnson et al. (U.S. Pat. No. 5,234,529) describe using capacitive shields in ICP reactors to limit the capacitive coupling between the RF coil and the plasma. Moreover, Zarowin and Bollinger (U.S. Pat. No. 5,290,382) disclose an interactive flange which provides a surface separate from the substrate to consume the active species.

Accordingly, there is a need for an apparatus and method which can provide improved adjustment and control of a spatial distribution of a plasma density and/or a spatial distribution of a chemical composition of the plasma. In particular, it is necessary to accurately control the uniformity of a plasma in the vicinity of a substrate, thereby controlling the uniformity, across the surface of the substrate, of a reaction caused by the plasma.

SUMMARY OF THE INVENTION

It is therefore an object of the invention to provide a system and method which can adjust the spatial distribution of a plasma and/or the spatial distribution of chemicals within a plasma, particularly a plasma used for processing a substrate.

According to one aspect of the invention, a recombination surface is provided proximate to a selected local region of a plasma, in order to increase a rate of recombination of ions and electrons, thereby reducing a density of at least one chemical component of the plasma, in the selected local region. In particular, by providing a recombination member having a recombination surface of a predetermined geometry and/or material, the distribution of the plasma and/or the distribution of chemicals within the plasma can be controllably adjusted.

According to another aspect of the invention, a conductive shielding element is provided in order to adjust the electric field in the device, thereby controlling a rate of production of ions and free electrons in a selected local region. The conductive shielding element locally reduces an amount of power provided to the selected region of the plasma, thereby reducing the plasma density in the region. The power supplied to the selected region of the plasma is reduced by providing either a conductive element with a current path parallel to an electric field being supplied by a power source, or a conductive loop with a current path encircling a portion of a magnetic field supplied to the plasma. One or more conductive elements can be included in a conductive shielding element, which can be used as an electrical and/or magnetic shield for reducing the amount of power supplied to the plasma in one or more selected local regions.

The invention allows the spatial distribution of the plasma and/or the spatial distribution of chemicals within the plasma to be adjusted, thereby allowing for the control, reduction, or elimination of spatial variations when processing with a plasma. In particular, the spatial variation of the reaction rate or chemistry of a reaction on the surface of a substrate can be controllably adjusted. Consequently, smaller line widths can be achieved, and higher integration densities can be obtained. In addition, rates of device defects can be reduced, resulting in increased manufacturing yield and reduced manufacturing costs.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

Figure 4A:
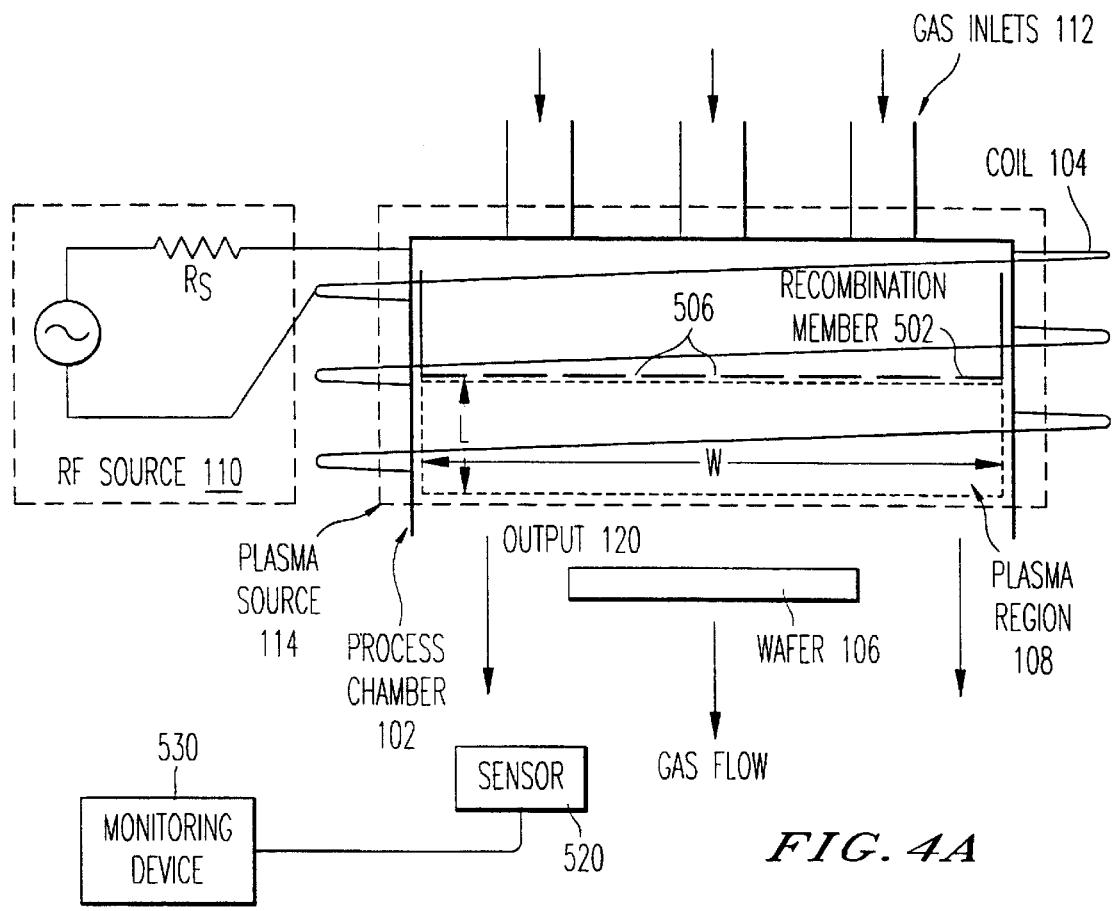
FIG. 4A is a schematic illustration of a first embodiment of a plasma processing system having a recombination member according to the invention.

Referring now to the drawings, in which like reference numerals designate identical or corresponding parts throughout the several views, FIG. 4A is a schematic illustration of a first embodiment of a plasma processing system having a recombination member. In this embodiment, RF power is coupled into a process chamber 102 through helical coil 104 acting as an inductive coupling element. Gases are introduced into the chamber 102 through gas inlets 112, and an RF source 110 supplies power to the plasma coupling element 104. Additional plasma coupling elements to which power is supplied can include a substrate holder, such as an electrostatic chuck, or a bias shield (i.e., a shield enclosing a plasma and used to couple power into the plasma).

Plasma is initiated by the RF power in a plasma region 108 of the chamber 102, and the plasma reacts with a workpiece, such as a wafer 106 or a flat panel display. In order to improve power transfer from the RF source 110 to the plasma coupling element 104, an impedance matching network (MN) can be used. The matching network MN transforms the input impedance of the plasma coupling element 104 to match the output impedance of the RF source 110 more closely. Additional details about matching networks can be found in co-pending application Ser. No. 60/059,176, filed on Sep. 17, 1997, incorporated herein by reference.

Although the present invention is described with reference to RF generated plasma, it is to be understood that various aspects of the present invention are also applicable to systems having power sources which operate at frequencies other than RF. Furthermore, the invention can also be advantageously utilized in systems which do not include inductive plasma coupling elements (e.g., capacitively coupled sputtering systems).

In accordance with one of the advantageous features of the invention, as shown in FIG. 4A, a recombination member 502 is provided within a plasma source 114 in order to adjust the dependence or variation of plasma density on position across the output 120 of the plasma source 114. The recombination member 502 reduces the local plasma density in a selected region by increasing the local rate of recombination of ions and free electrons. More specifically, the recombination member stimulates recombination of ions with electrons by an ambipolar diffusion process, in which the recombination member attracts electrons to its recombination surface and traps them on the surface. The electrons attract and recombine with ions, thereby producing neutral atoms and reducing the plasma density in a region adjacent to the recombination surface. In fact, providing a recombination member can be viewed as altering the effective geometry of a process chamber, which alters the plasma density and its dependence as a function of location across the output 120, thereby altering processing of a wafer 106. Moreover, in an alternate embodiment, the surface of the recombination surface is treated to improve recombination generally, and to alter the selectivity of the recombination with the recombination surface as opposed to other surfaces.

Figure 1:
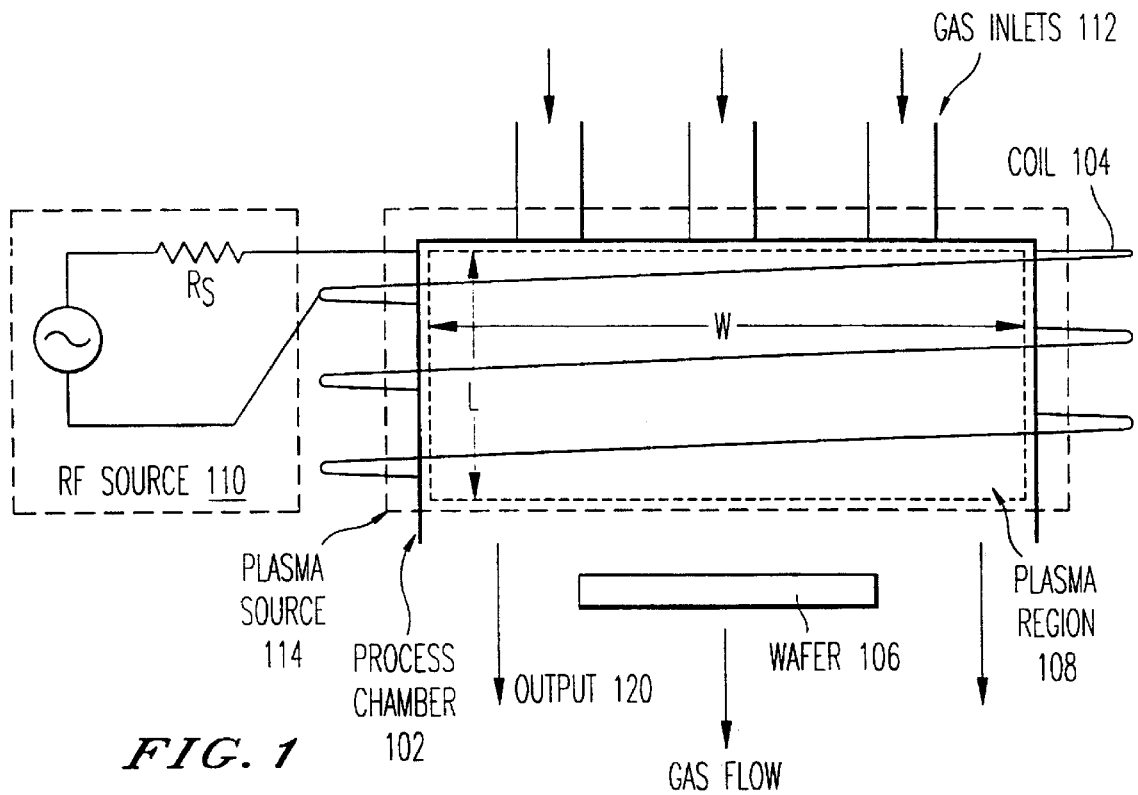
FIG. 1 is a schematic illustration of an example of an inductively driven plasma system.
Figure 2:
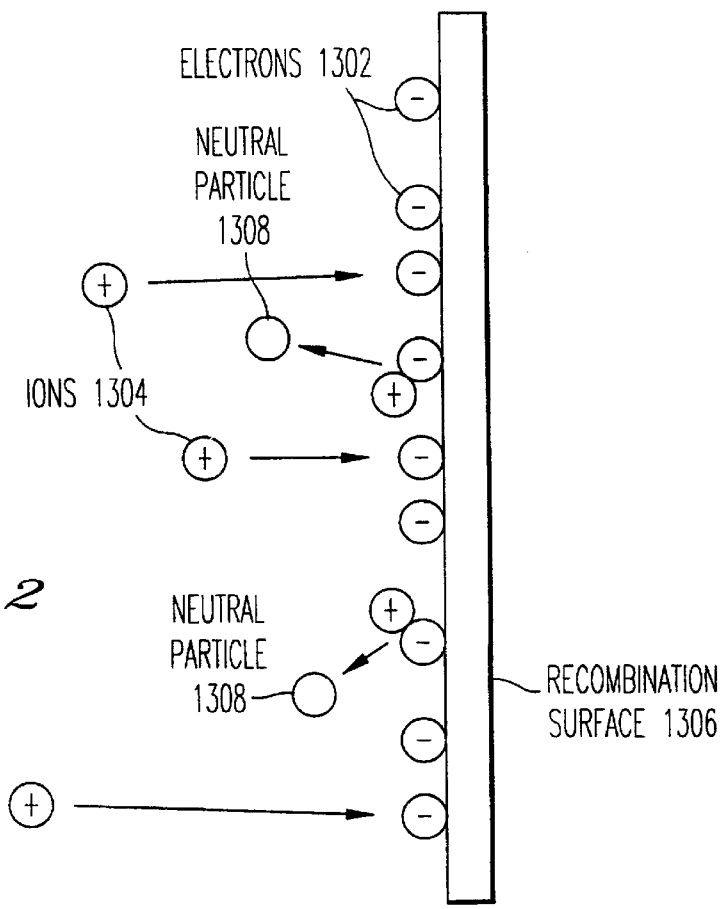
FIG. 2 is a schematic illustration of an ambipolar diffusion process.
Figure 3A:
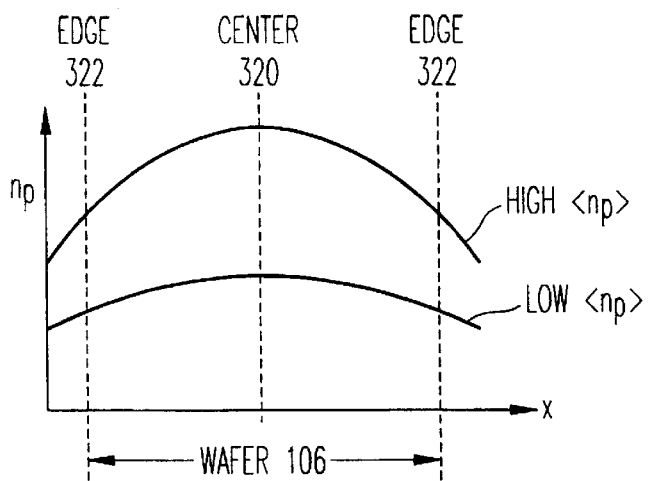
FIGS. 3A and 3B are graphs of non-uniform plasma density versus location across the outputs of plasma sources used for processing substrates.
Figure 3B:
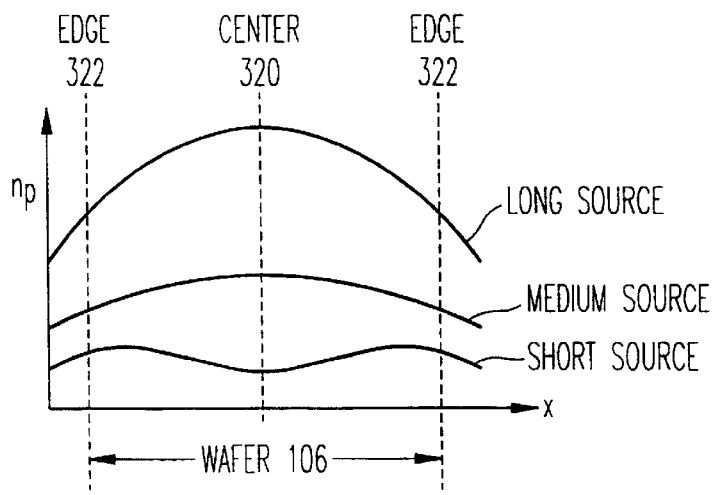
Figure 3C:
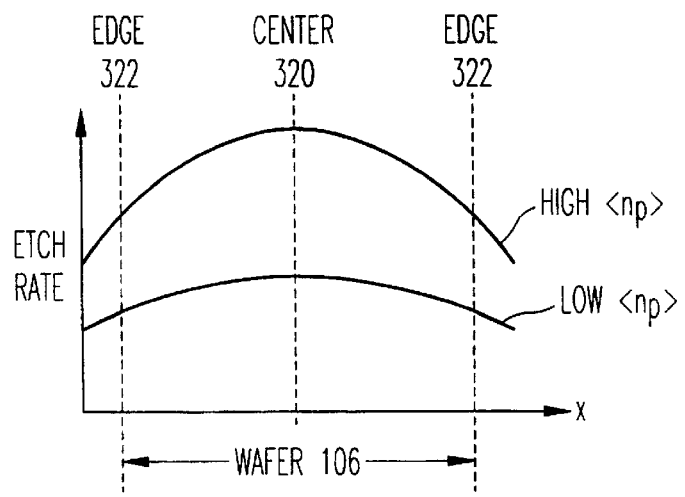
FIG. 3C is a graph of etching rate versus location along the surface of a substrate being processed by a non-uniform plasma.
Figure 5A:
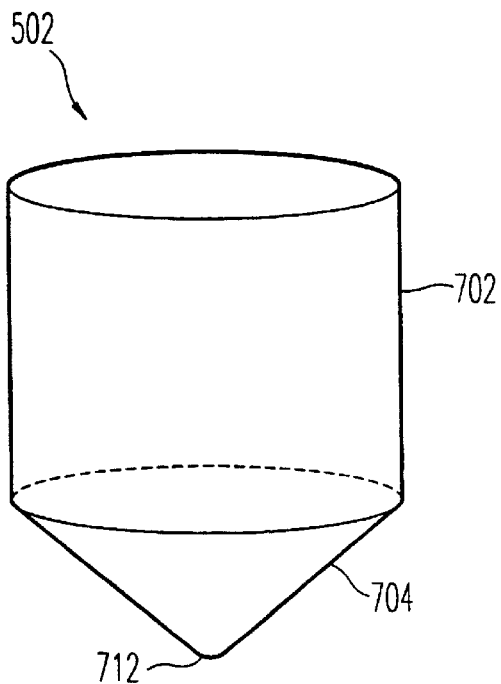
FIGS. 5A–5F are schematic illustrations of other recombination members for adjusting plasma density distribution according to the invention.

In the first embodiment, the recombination member 502 of FIG. 4A is cylindrical in shape and has a solid circular bottom surface. The diameter of the recombination member 502 is nearly as large as the inner diameter of the chamber 102. By disposing the recombination member 502 further into the plasma source 114, the effective length L of the plasma source 114 is reduced, while the effective width W of the plasma source is not significantly changed. As a result, the effective aspect ratio L/W of the plasma source 114 is reduced. Without the recombination member 502, the plasma source 114 of FIG. 5A is "long", i.e., L/W is large enough to cause a peak in $n_p$ near the center of the source 114, as illustrated by the "long source" curve of the graph of FIG. 3B. By adding the recombination member 502 of FIG. 4A, the peak in the center of the source can be reduced, as illustrated by the curve for a "medium" length source in FIG. 3B. Therefore, the plasma density can be made more uniform across the output of the source. If the recombination member 502 is replaced with a modified recombination member which is disposed still further into the plasma source 114, the peak plasma density near the center of the plasma source 114 is reduced further. In fact, the plasma density could be made lower in the center of the plasma source than near the edges of the plasma source, as illustrated by the "short source" curve of FIG. 3B by using the modified recombination member such that the aspect ratio is very small. Likewise, other recombination members can replace the recombination member 502 to produce any desired aspect ratio L/W. For example, in a system which includes a plasma source having a diameter of 35 cm, a tungsten silicide etching process may require an HCl plasma having a pressure of 5 mTorr, whereas a silicon oxide etching process may require an HCl plasma having a pressure of 80 mTorr. For the tungsten silicide process of this example, optimum uniformity of etching is obtained with a plasma source having an effective length of a 40 cm, whereas, for the silicon oxide process of this example, optimum uniformity of etching is obtained with a plasma source having an effective length of 20 cm. If the plasma source has previously been used for tungsten silicide etching and, therefore, includes a recombination member causing the effective length of the plasma source to be 40 cm, the system can be easily converted to a silicon oxide etching system by simply replacing the existing recombination member with a recombination member which is 20 cm longer, thereby reducing the effective length of the plasma source to 20 cm.

Figure 4B:
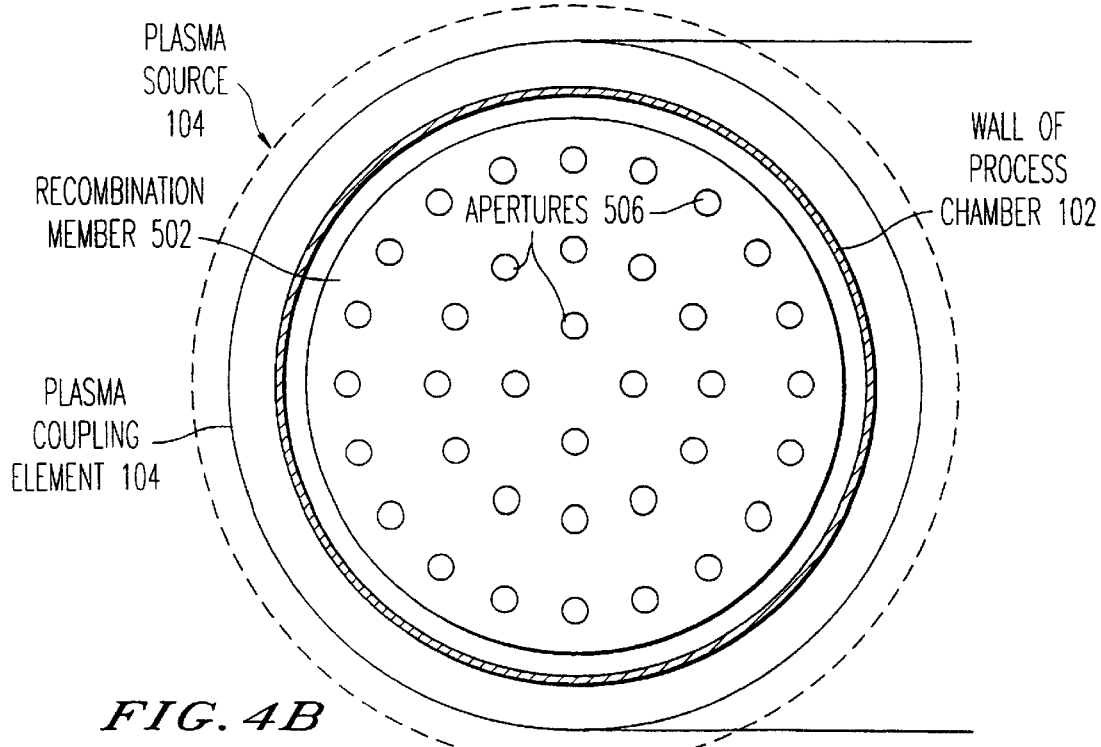
FIG. 4B is a cross-sectional view of the recombination member of the plasma processing system of FIG. 4A.

The recombination member 502 of FIG. 4A includes apertures 506 through which gas is supplied to the plasma. By allowing gas to flow through the recombination member 502, apertures 506 provide the benefit of improved plasma coverage of a substrate. In particular, by providing the gas near many regions of a substrate, as opposed to only near the edges, the apertures 506 allow plasma to be supplied more readily to the center region of the substrate. A cross-section of the apertures is shown in FIG. 4B. In this aperture configuration, there is an approximately equal number of apertures per unit area across the whole recombination member 502, but there is not a hole in the middle since the middle typically has a higher ion density anyway.

Furthermore, a processing system according to the invention alternately can include a sensor 520 for measuring the distribution of density of the plasma and/or the distribution of chemicals within the plasma. The sensor 520 (e.g., an optical sensor, a chemical sensor, or a radio sensor) is preferably disposed next to the substrate being processed. The output of the sensor 520 can be sent to an external monitor device 530 and can be recorded in a storage device and/or displayed to an operator. The information can be utilized to determine whether the plasma conditions are unsuitable, in which case the recombination member 502 can be replaced with a different recombination member in order to correct the problem. In addition, the wafer 106 can be removed from the system and analyzed with regard to distribution of etching rate of an etching process, distribution of thickness of a deposited film, distribution of stoichiometry (i.e., chemical composition) of a deposited film, morphology of a deposited film, etc. The results of the analysis of the wafer 106 can be used to determine whether it is necessary to replace the recombination member 502 with a recombination member having a different geometry.

In addition, a plasma processing system according to the invention can be utilized in a "continuous process," in which multiple processing steps, each with different processing conditions, are performed by the same system. For example, in some cases a semiconductor wafer is coated with a silicon oxide layer, which serves as a gate insulator for MOS transistors. The silicon oxide layer subsequently can be coated with a layer of tungsten silicide, which serves as a gate conductor for the MOS transistors. An exemplary process can include an etching step for a tungsten silicide layer, followed by an etching step for the gate oxide layer. The tungsten silicide etching step can require a plasma containing etching gas (e.g., HCl, $Cl_2$, $CF_2$, and/or $C_2F_8$) and at a particular pressure, e.g., 5 mTorr, whereas the gate oxide etching step can require an etching plasma having a different pressure, e.g., 80 mTorr. The gas mixture used for the gate oxide etching step can have a composition either similar to or different than that of the gas mixture used for the tungsten silicide etching step, depending on factors such as the desired etching rates of the different layers.

Figure 4C:
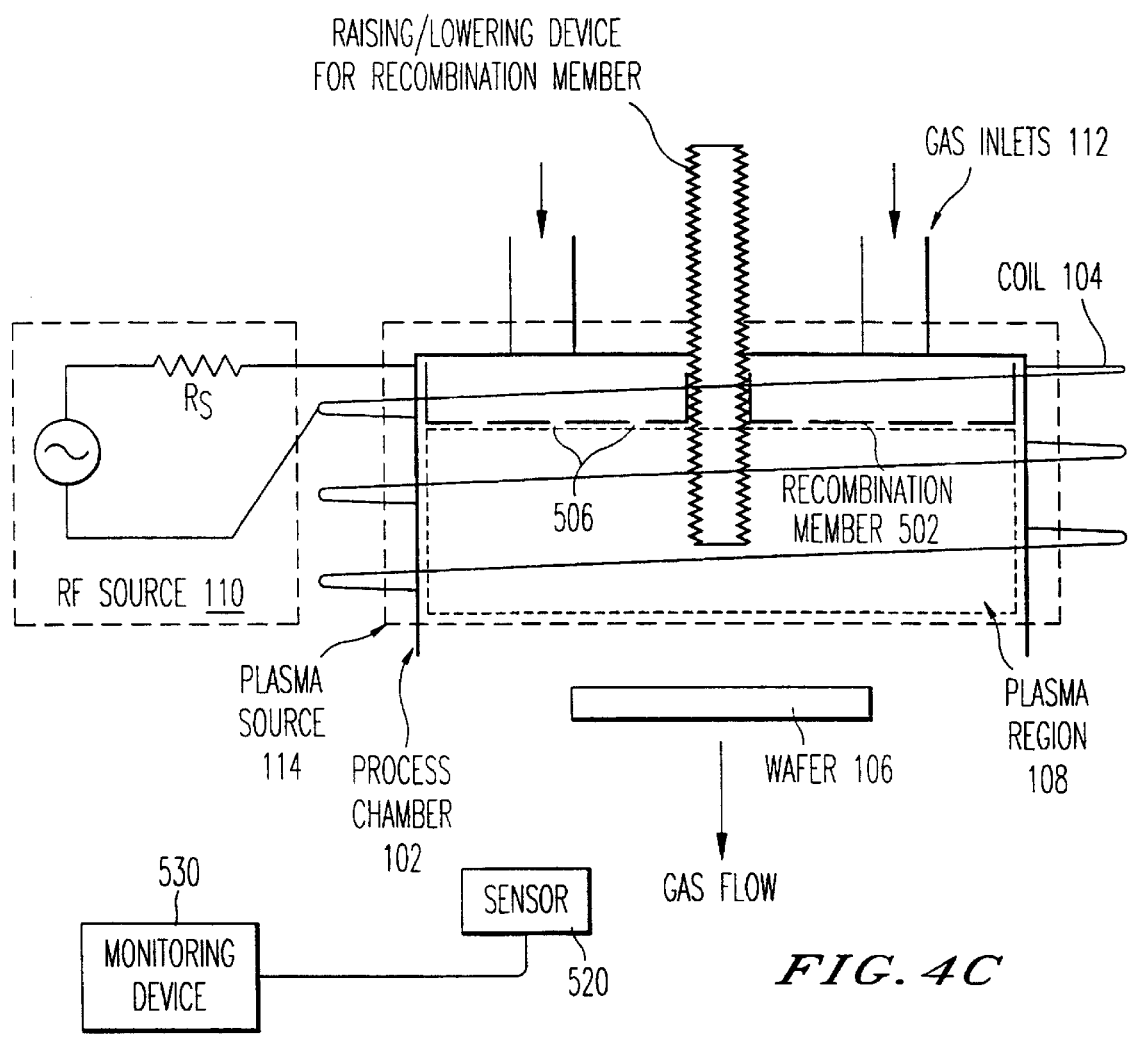
FIG. 4C is a schematic illustration of a second embodiment of a plasma processing system according to the invention.

In this example, the processing of the substrate is performed using a single chamber and a single plasma source having a diameter of 35 cm. For the exemplary tungsten silicide process (i.e., the gate conductor etching step), optimum uniformity of etching is obtained with a plasma source having an effective length of 40 cm, whereas, for the exemplary silicon oxide process (i.e., the gate insulator etching step), optimum uniformity of etching is obtained with a plasma source having an effective length of 20 cm. Both processing steps can be performed in the same system without removing the wafer, provided that the plasma source includes a movable recombination member such as the recombination member 502 illustrated in FIG. 4C. The processing system of FIG. 4C includes a plasma source 114 having an effective length L and an effective width W, corresponding to the length and width of a plasma region 108 containing plasma. The plasma source 114 further includes the aforementioned recombination member 502, which is mechanically connected to process chamber 102 by a raising/lowering device. The raising/lowering device can be a bellows 512 (e.g., fabricated from anodized aluminum or stainless steel), a screw mechanism as shown, or any other device which allows the height of the recombination member to be adjusted. A motor (not shown) or other suitable actuator can be utilized to move the recombination member vertically, thereby changing the effective length L of the plasma source 114. In order to process a wafer 106, a gas mixture is supplied through gas inlets 112 and excited into a plasma state by RF power supplied to the coil 104. Similar to the recombination member of FIG. 4A, the recombination member 502 of FIG. 4C includes apertures 506 for more uniform distribution of gas supplied to the plasma. As illustrated in FIG. 4C, the raising/lowering device is advantageously disposed within the recombination member 502, to minimize an accumulation of process reaction products upon the surfaces of the raising/lowering device. Furthermore, since the recombination member 502 separates the raising/lowering device from the wafer 106, the effect on the wafer 106 of particulate contamination produced by the raising/lowering device is further reduced. In accordance with an additional aspect of the invention, a monitor 530 is utilized to operate the motor in response to a signal received from a sensor 520 which measures the distribution of plasma and/or the distribution of chemicals within the plasma. Furthermore, the monitor 530 can control the motor in response to other process parameters such as RF power levels, matching of RF power sources to plasma coupling elements, and rate of gas flow into the system. The sensor 520 can be, e.g., an optical sensor or a chemical sensor. In addition, the monitor 530 changes the position of the recombination member 502 at the end of a particular step upon receiving a command from a process controller, thereby preparing the system for a next processing step which may require different plasma conditions.

A recombination member according to the invention can also be advantageously utilized to adjust the spatial distribution of chemicals within a plasma processing system. For example, a gas containing $C_2F_8$ can be excited into a plasma state, thereby producing reactive species, such as $CF_2$, which can be used to process a substrate. In the vicinity of the recombination member, certain ionic species can be neutralized more readily than others. For example, $CF_2$ ions may be attracted to the recombination member more readily than other, e.g., non-reactive, species. Therefore, by disposing a recombination member near a particular region of a substrate, the local etching rate in the region can be reduced by ambipolar diffusion. In addition, chemical species produced by the etching process (e.g., reaction products and material removed from the substrate) can also be adsorbed by the recombination member, thereby further modifying the chemistry of the plasma near the recombination member. By adjusting plasma chemistry, etching rates of an etching process can be adjusted. In addition, deposition rate, film stoichiometry (i.e., chemical composition), and/or morphology of a deposited film can also be adjusted. By adjusting the geometry and/or the position of the recombination member, process uniformity and/or control can be enhanced.

Furthermore, in accordance with an additional aspect of the invention, a recombination member such as 502 in FIGS. 4A and 4C can be used to adjust surface temperature of a substrate during a plasma process. By heating or cooling the recombination member 502, a substrate adjacent to the recombination member can be heated or cooled due to radiative, convective, or conductive heat transfer. As a result, reaction characteristics (e.g., etching rate of an etching process or film morphology of a film produced by a deposition process) can be adjusted across the surface of a substrate.

In an alternate embodiment of the present invention, the recombination member 502 is provided to reduce the density of the plasma, or particular chemicals within the plasma near the edges of the source. If the density of the plasma, or of particular ion species, tends to be higher near the edges of the output 120 of the plasma source 114 and lower near the center, this non-uniformity can be reduced by utilizing a recombination member 502 which is open in the center and which provides a recombination surface primarily near the perimeter of the plasma source 114. One such recombination member 502 is hollow and cylindrical and has a diameter nearly as large as the inner diameter of the process chamber 102.

Such a recombination member is, preferably, formed from chemically inert material, which can be insulating (e.g., quartz, alumina, sapphire, glass, and/or plastic) or conductive (e.g., anodized aluminum). If it is conductive, the current paths created by the conductive material can affect the coupling of the helical coil 104 to the plasma. Therefore, when using a conductive recombination member, it can be beneficial to provide slots in the conducting material in order to interrupt current paths which could otherwise affect the coupling between the plasma coupling element and the plasma.

The recombination member can have a diameter nearly as large as the inner diameter of the chamber in which it is utilized or, alternatively, the recombination member can be smaller in diameter than the inner wall of the chamber. Furthermore, the recombination member and/or the chamber can have non-cylindrical, e.g., rectangular, spherical, hemispherical, conical or ellipsoidal geometries.

FIG. 5A illustrates a first embodiment of a recombination member 502 according to the invention. The recombination member 502 includes a barrel 702 and an end 704 and can be hollow or solid. In the embodiment of FIG. 5A, the end 704 of the recombination member 502 has a protruding, conical geometry, in order to suppress the plasma to a greater degree in the center than it does at the edges (i.e., the perimeter). The recombination member 502 is constructed from an insulating material (e.g., quartz, alumina, sapphire, glass, and/or plastic).

Figure 5B:
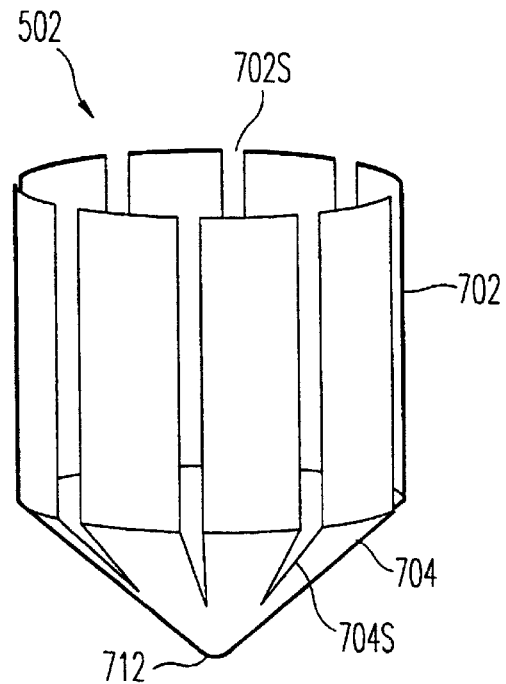

In a second embodiment illustrated in FIG. 5B, the recombination member 502 can be constructed of a conductive material (e.g., anodized aluminum), in which case slots 702S and 704S can be included in the barrel 702 and the end 704, respectively, in order to disrupt circulating currents which could be induced in the recombination member 502 by the coil 104. Slots 702S can be uniform or tapered to increase in width from the top to the bottom of the barrel or from the bottom to the top of the barrel, depending upon, for example, the desired plasma density distribution. Furthermore, slots 704S can be uniform or tapered to increase in width from the center to the perimeter of the end 704 of the recombination member 502 or from the perimeter to the center of the end 704, depending on the desired plasma density distribution.

According to an additional aspect of this feature of the invention, the tip 712 of the recombination member 502 (of either FIGS. 5A or 5B) is preferably rounded in order to reduce local electric fields, thereby reducing the danger of electrical arcing in the plasma. As a result, undesirable effects of arcing, such as damage to the substrate or the system, are mitigated.

Eliminating sharp or narrow features can also be advantageous for reducing particulate contamination of the system, since such features often are a source of contamination. In particular, certain sharp features can be thermally isolated from their surroundings and can, therefore, be susceptible to significant heating and cooling as process conditions within the system are changed, resulting in significant expansion and contraction of the sharp features. Since surfaces within the system can become coated with a film of contaminants from the process, the expansion and contraction can cause portions of the film of contaminants to "flake off," resulting in the production of particles which can cause defects in the substrate being processed. Therefore, in accordance with the invention, the rounded tips 712 of the recombination members 502 of FIGS. 5A and 5B are advantageous for reducing the production of particulates (i.e., contaminating particles).

Figure 5C:
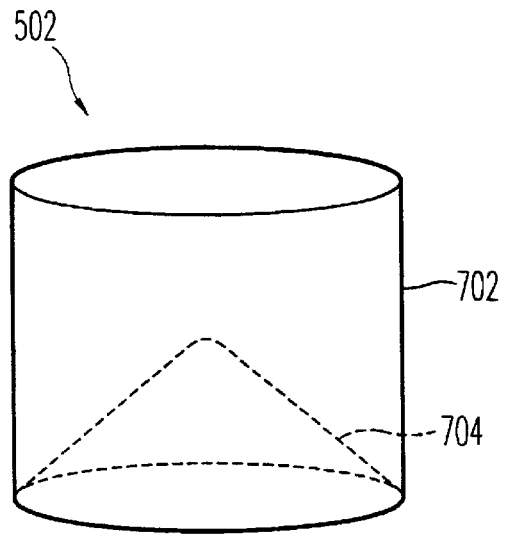
Figure 5D:
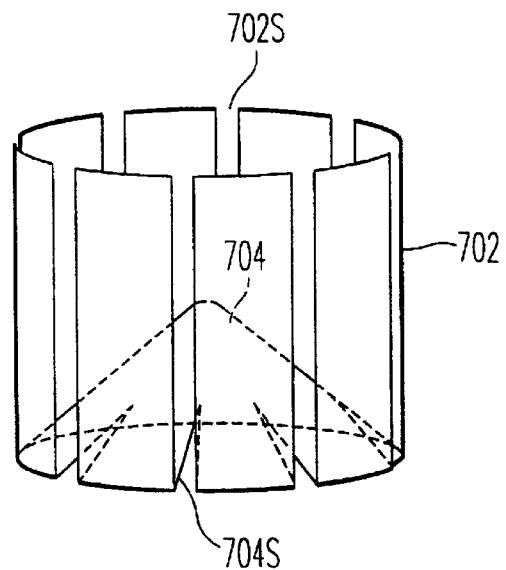

FIG. 5C illustrates an alternative example of an insulating recombination member 502 according to the invention. In this example, the barrel 702 of the recombination member 502 is cylindrical in shape and the end 704 has an inverted (i.e., concave) cylindrical geometry. Consequently, the recombination member 502 protrudes more deeply into the plasma near the perimeter of a source and less deeply in the center of the source in order to suppress the plasma to a greater degree near the perimeter than it does at the center. Although the recombination member 502 of FIG. 5C is fabricated from insulating material, a recombination member with an inverted cylindrical end 704 can, alternatively, be composed of conductive material, as illustrated in FIG. 5D. Similarly to the example of FIG. 5B, the recombination member 502 in FIG. 5D includes slots 702S and 704S in order to disrupt induced circulating currents. Slots 702S can be uniform, tapered to increase in width from the top to the bottom of the barrel 702 or from the bottom to the top of the barrel 702. Furthermore, slots 704S can be tapered to increase in width from the center to the perimeter of the end 704 of the recombination member, or from the perimeter to the center of the end 704, depending on the desired plasma density distribution.

Figure 5E:
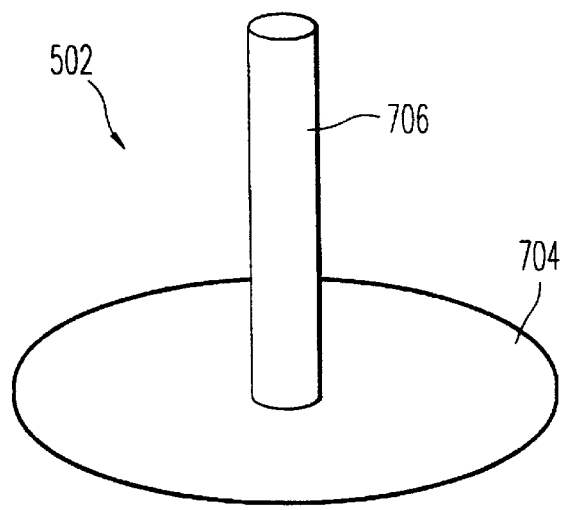
Figure 5F:
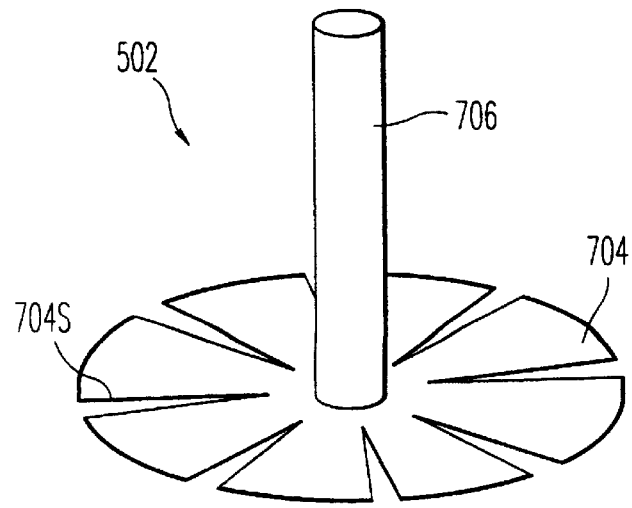

Alternatively, a recombination member can have a "shaft and disk" geometry according to the invention, as illustrated in FIGS. 5E and 5F. FIG. 5E schematically represents a recombination member 502 which includes an insulating disk 704 affixed to the end of a shaft 706. In some cases, the shaft 706 can be fabricated from conductive material, provided that its diameter is small enough so that it does not significantly affect the coupling of the plasma coupling element to the plasma. Furthermore, as illustrated in FIG. 5F, the disk 704 of the recombination member 502 can also be fabricated from a conductive material, in which case it can include slots 704S in order to prevent induced circulating currents which could otherwise effect coupling of power to the plasma.

In accordance with another embodiment of the invention, the slots of the recombination members illustrated in FIGS.

5B and 5D are partially or completely filled with an insulating material (e.g., alumina), in order to reduce or eliminate the flow of gas through the recombination member. Filling the slots with an insulating material can provide the additional advantage that the available recombination area can be made uniform in the azimuthal direction, thereby providing improved azimuthal uniformity of the density and/or composition of the plasma, compared to the plasma uniformity resulting from unfilled slots. Furthermore, by filling the slots with an insulating material, narrow edges can be reduced in size or eliminated, thereby mitigating the production of particulates at the edges, which could otherwise introduce defects into a substrate being processed, as discussed earlier with reference to FIGS. 5A and 5B. Although the above discussion of FIGS. 5A–5F have been made in reference to symmetric recombination members, the recombination members may also be asymmetric in order to alter the density/chemical composition of the plasma. Further, the recombination member may also be equipped with independently controllable activators for opening or closing individual holes or slots in recombination members.

According to an additional aspect of the invention, a plurality of recombination members can be disposed within a plasma source in order to provide improved control of the distribution of the plasma and/or the distribution of chemicals within the plasma. In one embodiment, a solid, cylindrical central recombination member is disposed concentrically within a hollow, cylindrical peripheral recombination member such that recombination members are both disposed concentrically within the plasma source 114. When a gas mixture is supplied to this combination in the presence of an RF power supplied to a plasma coupling coil 104, the gas is excited into a plasma state. The recombination members can be fabricated from insulating material or, alternatively, from conductive material, as discussed above. Each of the recombination members can be independently adjusted by changing its position axially within the plasma source in order to provide a radially uniform plasma density or chemistry at the output of the plasma source. For example, if the density or chemical composition of plasma at the output of the plasma source is greater near the center of the source, a central recombination member is disposed further into the plasma source in order to mitigate the radial non-uniformity of plasma density or composition. Alternatively, if the density or chemical composition of plasma at the output of the plasma source is greater near the perimeter of the source than it is near the center, the peripheral recombination member is disposed further into the plasma source 114 to correct the non-uniformity. In addition, more than two recombination members can be provided within a plasma source according to the invention.

Figure 6A:
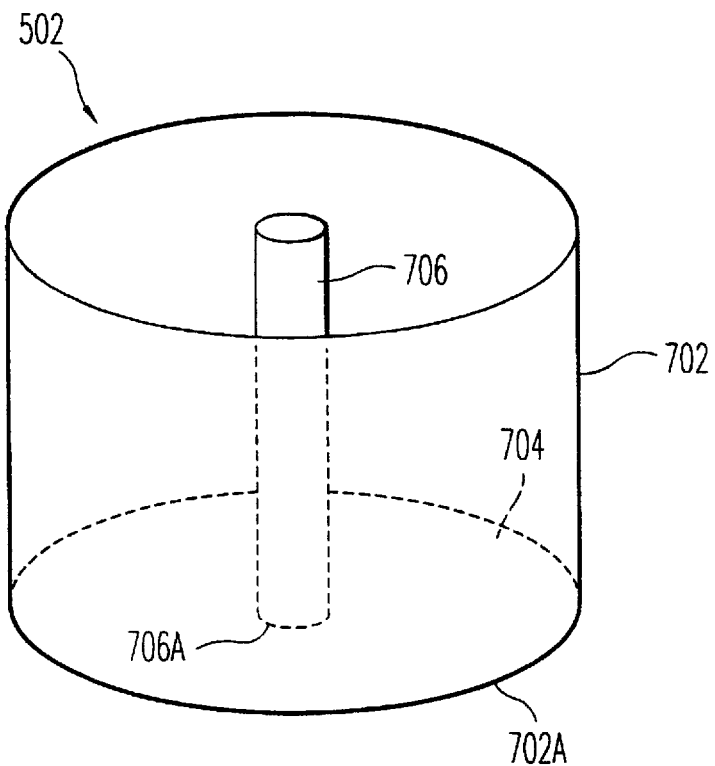
FIGS. 6A and 6B are schematic illustrations of deformable recombination members for adjusting plasma density distribution according to the invention.
Figure 6B:
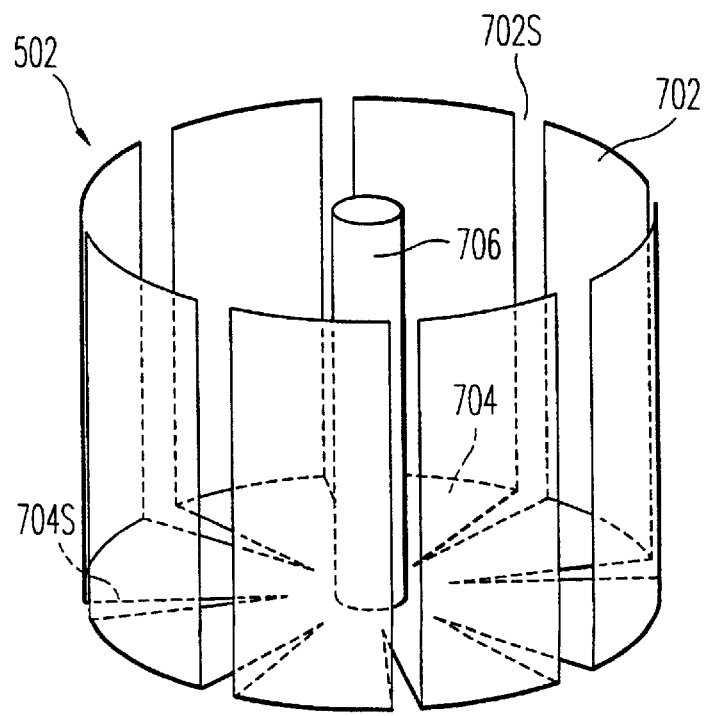

An advantageous recombination member according to the invention can be fabricated from flexible (i.e., deformable) material, as illustrated in FIGS. 6A and 6B. The recombination member 502 of FIG. 6A includes a shaft 706, a barrel 702, and a flexible end 704. Since the end 704 is flexible, the relative vertical position of the shaft 706 with respect to the barrel 702 is adjustable. Therefore, an excess of density of plasma, or of particular chemical components thereof, either in the center of the plasma source, or near the perimeter of the plasma source, can be mitigated, while avoiding the need to replace the recombination member. For example, in the case of excess plasma density near the center of the plasma source, the lower end 706A of the shaft 706 can be disposed at a lower vertical position (and, therefore, further into the plasma source) than the lower edge 702A of the barrel 702, thereby reducing the plasma density more significantly near the center of the source. In the case of excess plasma density near the perimeter of the plasma source, the lower end 702A of the barrel 702 can be disposed at a lower vertical position than the lower end 706A of the shaft 706, thereby reducing the plasma density more significantly near the center of the source. In the example of FIG. 6A, the recombination member is fabricated from an insulating material. Alternatively, a similar recombination member can be fabricated completely or partially from a conductive material, as illustrated in FIG. 6B. The recombination member 502 of FIG. 6B functions in a manner similar to that of FIG. 6A. However, since the barrel 702 and the end 704 of the recombination member 502 of FIG. 6B are formed from a conductive material, it can be beneficial to provide slots 702S in the barrel 702 and/or slots 704S in the end 704, in order to prevent induced circulating currents. The slots 702S and 704S can, optionally, be partially or completely filled with insulating material in order to restrict or eliminate gas flow through the recombination member, as described earlier. Furthermore, depending upon the diameter of the shaft 706, it can be advantageous to provide similar slots (not shown) in the shaft. More specifically, compared to a shaft having a smaller diameter, a shaft having a larger diameter can, in some cases, be more likely to benefit from lengthwise slots.

Figure 7:
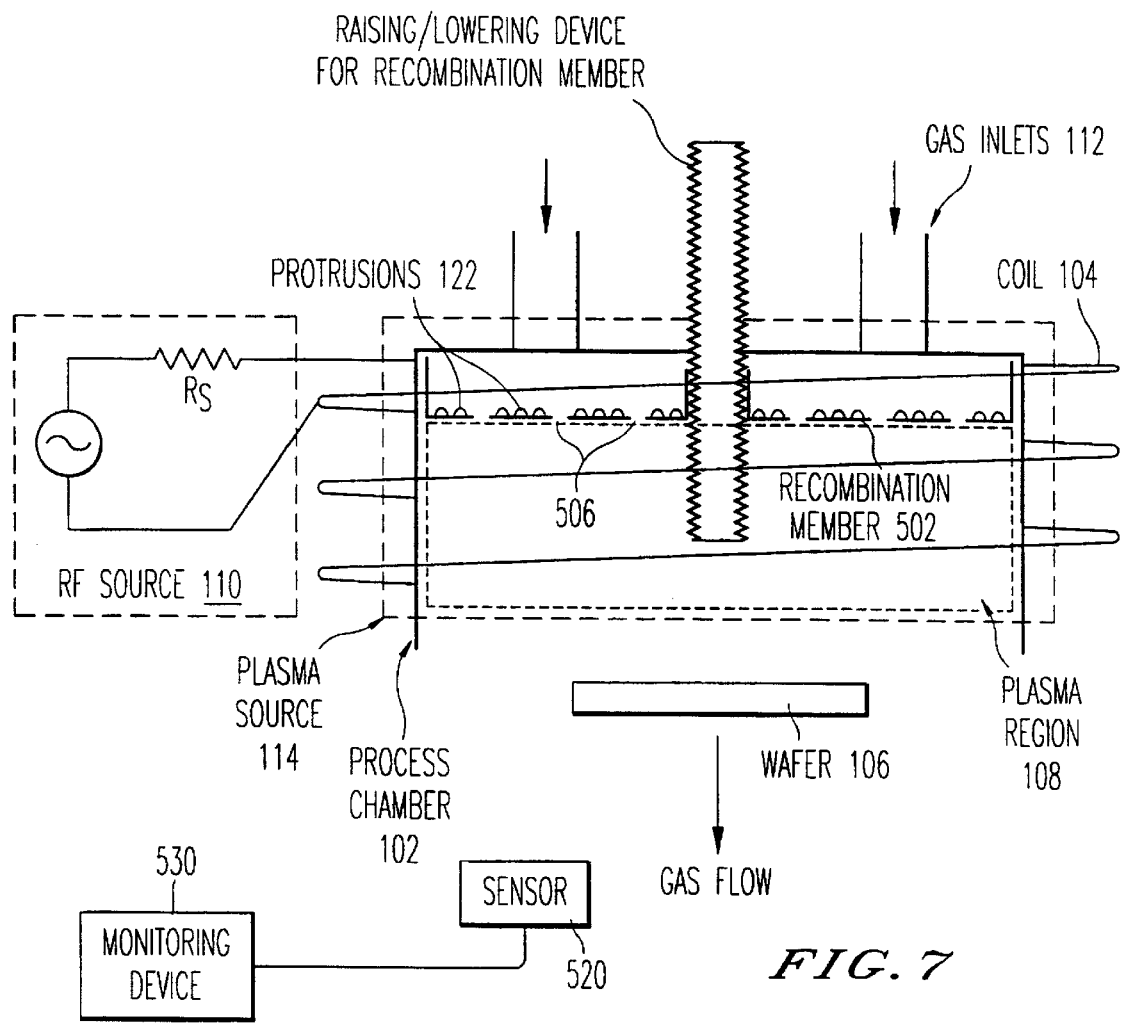
FIG. 7 is a schematic illustration of a third embodiment of a plasma processing system having a recombination member with an increased effective surface area of recombination.

A recombination member according to the invention can be formed with depressions and/or protrusions in order to increase its effective surface area. For example, the recombination member 502 of FIG. 7 includes protrusions 122. Increasing the effective surface area of the recombination member 502 can enhance the recombination effect that the recombination member has upon plasma in the plasma region 108, and, consequently, can provide further reduction of local plasma density.

In some cases, plasma within the plasma region 108 does not penetrate deeply between the protrusions 122 of the recombination member. Therefore, in order to further increase the effective surface area of a recombination member 502, an RF source (not shown) is utilized to couple RF power into the recombination member 502, thereby drawing plasma more deeply between the protrusions 122. The RF source 110 can, optionally, be coupled to the recombination member 502 through a matching network (MN).

Figure 8:
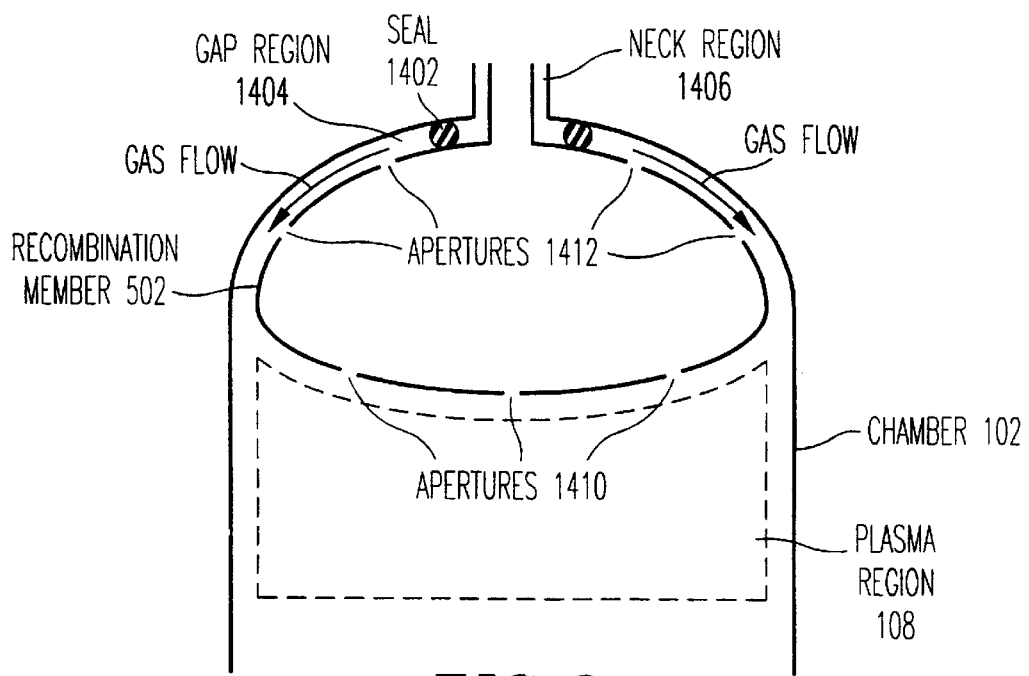
FIG. 8 is a schematic illustration of a plasma processing system providing gas flow through gaps between components to reduce particulate contamination in accordance with the invention.

According to an additional advantageous aspect of the invention, a plasma processing system can be constructed with a geometry that provides gas flow through narrow gaps between components to reduce the production of particulates. For example, in the processing system of FIG. 8, a recombination member 502 is disposed within a chamber 102 in order to adjust the spatial distribution of plasma within a plasma region 108 within the chamber. The recombination member 502 is provided with apertures 1410 through the bottom of the recombination member and apertures 1412 proximate to a gap region 1404 between the recombination member and the wall of the chamber 102. In the example of FIG. 8, a vacuum seal 1402 is provided below a neck region 1406 of the chamber, although the seal can, optionally, be provided within or above the neck region. The apertures 1412 near the gap region 1404 provide gas flow in downward direction, thereby flushing out contaminants and preventing the accumulation of films within the gap region. This can be advantageous because, in plasma processing systems, particulate contamination can sometimes be generated by films deposited within gaps between system components. In addition, it is to be understood that, although the gas flow of FIG. 8 is provided through the illustrated apertures 1412 in the recombination member 502, the gas flow can also be provided through inlets (not shown) in the neck region 1406 of the chamber 102 if the seal 1402 is positioned high enough. Inlets in the neck region 1406 can penetrate the chamber 102 and/or the recombination member 502 to provide gas flow through the gap region 1404.

Figure 9A:
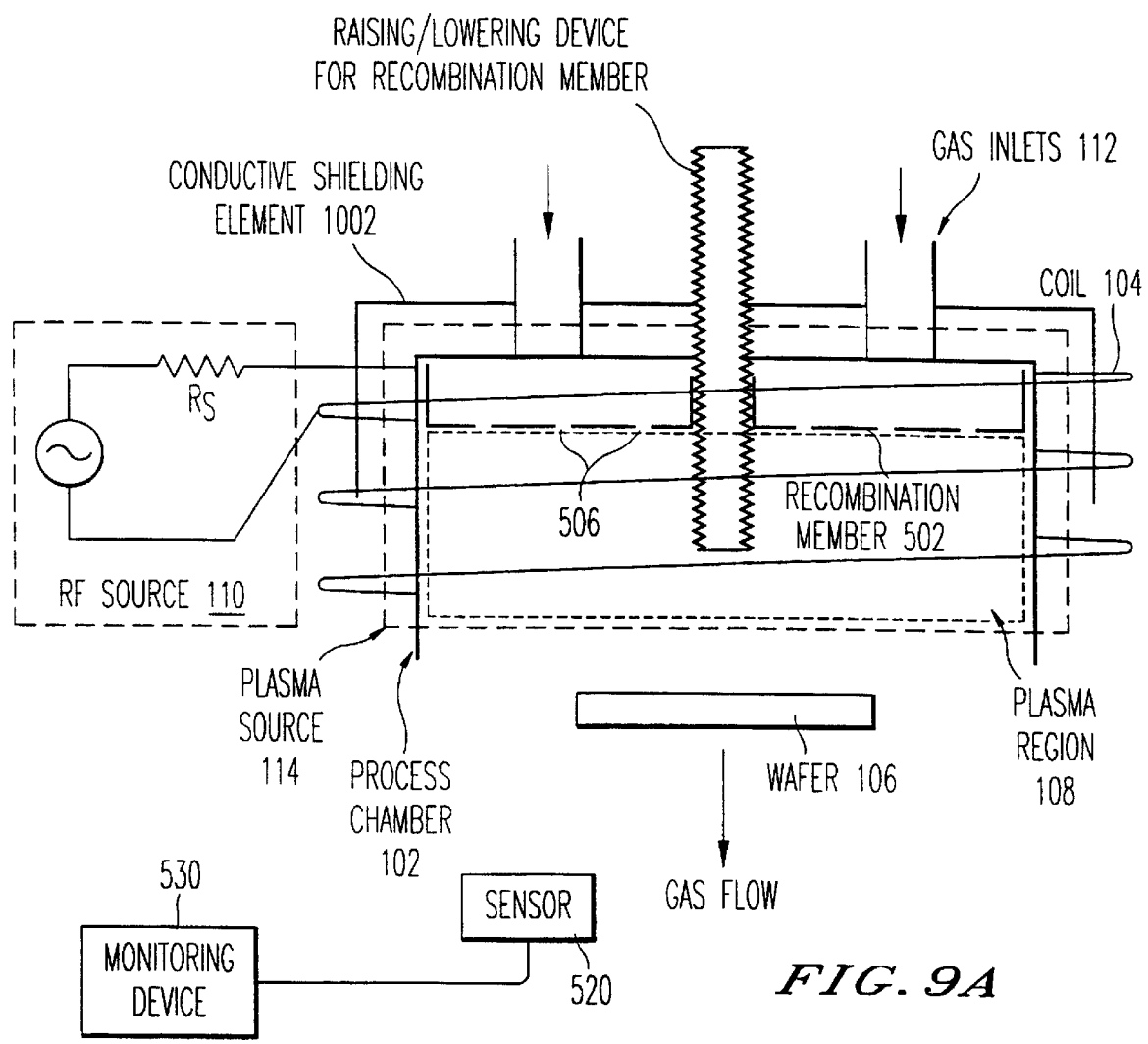
FIG. 9A is a schematic illustration of a fourth embodiment of a plasma processing system having a conductive shielding element.

FIG. 9A is a schematic illustration of a fourth embodiment having a conductive shielding element 1002 for adjusting the plasma density distribution within the source. When RF power is coupled into a process chamber 102 through the helical coil 104 the conductive shielding provides significant capacitive decoupling of the ionized gas from the supply of RF power. Therefore, the amount of power received by the shielded region is reduced. Furthermore, by changing the vertical position of the conductive shielding element 1002, the effective length L of the plasma source 114 can be varied, while the effective width W of the plasma source 114 can be kept essentially unchanged. As a result, the effective aspect ratio L/W can be varied.

Similarly to the recombination member 502 of FIG. 5A, the conductive shielding element 1002 of the invention can, optionally, be replaceable, in which case it can be removed and replaced by a conductive shielding element having a different size and/or geometry according to the requirements of the process being performed. For example, optimum uniformity of etching during a first etching process may be obtained with a shield (i.e., conductive shielding element) having a length of 40 cm, whereas optimum uniformity of etching for a second etching process may be obtained using a shield having a length of 60 cm. If a plasma source has previously been used for the first etching process and, therefore, includes a conductive shielding element having a length of 40 cm, the system can easily be converted to perform the second etching process by simply replacing the existing shield with a shield having a length of 60 cm.

Furthermore, a processing system which includes a conductive shielding element can include a sensor 520 for measuring the distribution of the plasma and/or the distribution of within of the plasma. If the sensor 520 indicates that plasma conditions (i.e., distribution of density and/or chemistry of the plasma) are unsuitable, the conductive shielding element 1002 can be replaced with a different shield in order to improve the plasma conditions. In addition, as discussed earlier, the wafer 106 can be removed from the system and analyzed in order to determine the distribution of a reaction across the surface of the wafer, thereby providing an indication of whether or not it would be preferable to replace the conductive shielding element 1002. Furthermore, the analysis of the wafer 106 can also provide an indication of the preferred size and/or geometry of a conductive shielding element used to replace the existing shield. In an alternate embodiment, a conductive shielding element in accordance with the invention can be disposed within a process chamber 102, in which case the shield is, preferably, formed from a chemically inert conductive material, such as anodized aluminum.

In addition, according to the invention, a conductive shielding element can also serve as a plasma coupling element. For example, an additional RF source can be used to supply RF power to a conductive shielding element 1002, thereby providing additional power to the plasma. The technique of supplying power to a conductive shielding element can be utilized to increase average plasma density and/or to provide an additional mechanism for controlling the distribution of density and/or the distribution of chemical composition of a plasma. Furthermore, in some cases, it can be beneficial to provide matching networks MN1 and MN2 to improve the RF matching of the RF sources to the coil 104 and the shield 1002, respectively.

Figure 9B:
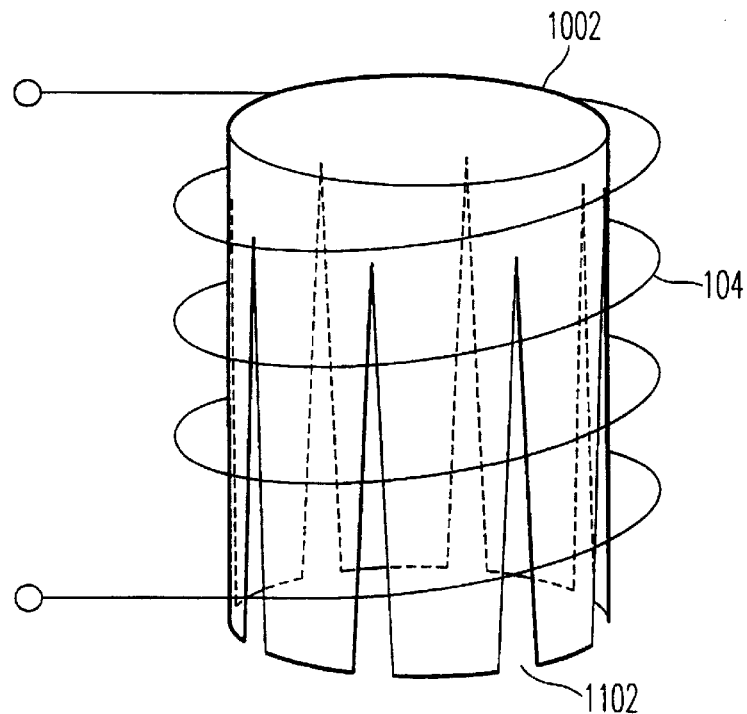
FIGS. 9B and 9C are schematic illustrations of conductive shielding elements for adjusting plasma density distribution according to the invention.

In an alternate embodiment, a conductive shielding element 1002 includes tapered slots 1102 to provide non-uniform coupling of a plasma coupling element 104 to a plasma. The geometry (e.g., the angle of taper) of the slots 1102 can determine the dependence of plasma density on axial location within the conductive shielding element 1002, thereby influencing the radial dependence of plasma density across the output of a plasma source. For example, as illustrated in FIG. 9B, slots 1102, which are wider at the bottom of the conductive shielding element 1002 than they are at the top of the conductive shielding element, can cause a reduction of plasma density near the top of the plasma source, thereby reducing the plasma density near the center of the output 120 of the source, while having less effect on the plasma density near the perimeter of the output of the source. The slots 1102 of FIG. 9B can be advantageously utilized for increasing the uniformity of a plasma which would otherwise have undesirably high density near the center of the output of the plasma source. In contrast, slots which are narrower at the bottom of the conductive shielding element than they are at the top of the conductive shielding element can cause a reduction of plasma density near the perimeter of the output of the plasma source. This can be advantageous for increasing the uniformity of a plasma which would otherwise have undesirably high density near the perimeter of the output of the plasma source. Alternatively, slots having uniform width from the top to the bottom of the conductive shielding element 1002 can, in some cases, have little effect on the axial uniformity of plasma density within the plasma source 114, thereby having less effect (compared to tapered slots) on the radial uniformity of plasma density at the output 120 of the source.

Figure 9C:
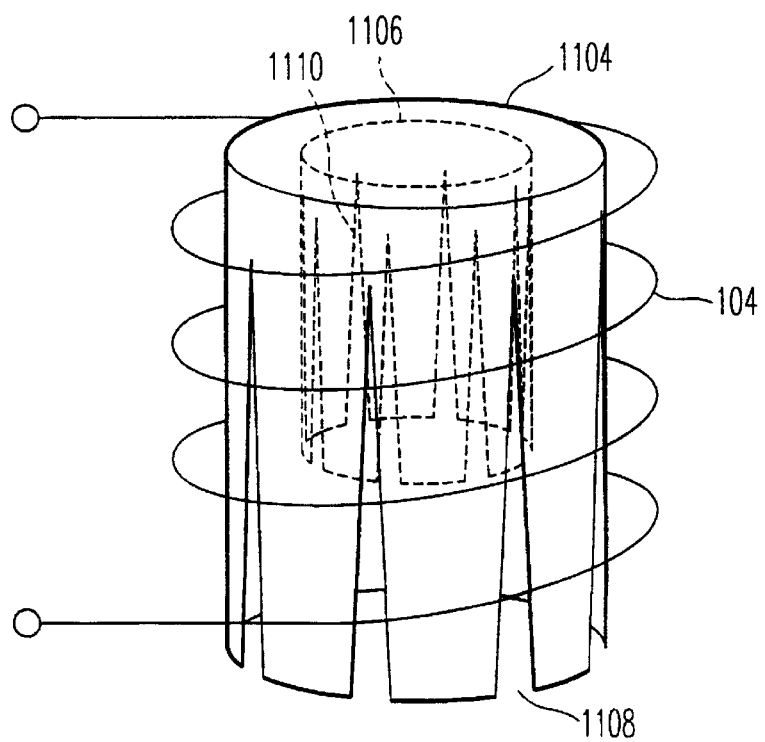

In addition, according to the invention, improved control of the radial dependence of plasma density can be obtained by using a plurality of conductive shielding elements 1104 and 1106 disposed between a plasma coupling element 104 and a plasma, as illustrated in FIG. 9C. For example, if the radial dependence of plasma density across the output of a plasma source is such that the non-uniformity cannot be mitigated using a single conductive shielding element 1104, it can be advantageous to utilize an additional conductive shielding element 1106, disposed internally to (i.e., underneath of) and concentrically within the first conductive shielding element 1104, in order to provide further reduction of the plasma density near the radial center of the plasma source.

Figure 10:
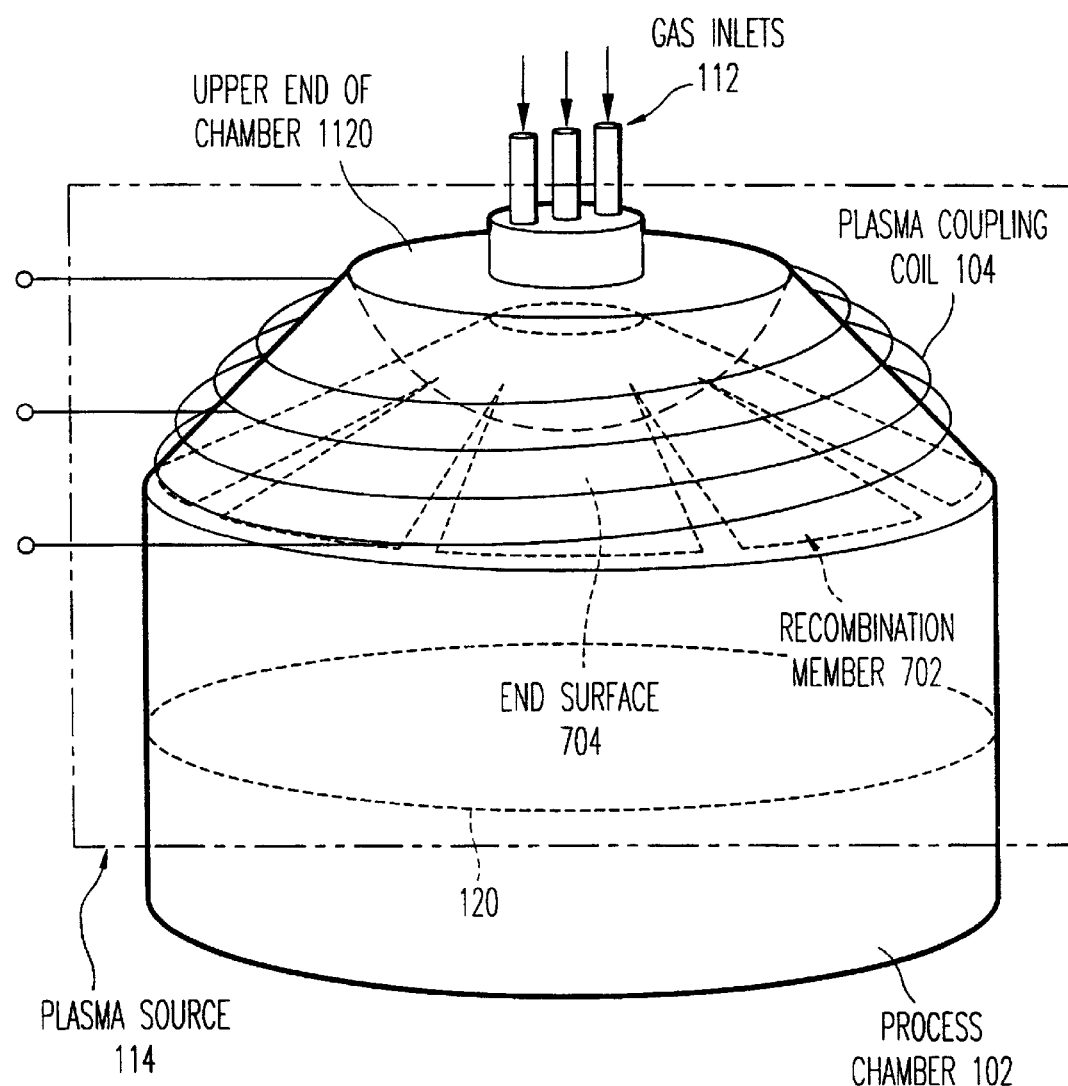
FIG. 10 is a schematic illustration of a fifth embodiment of a plasma processing system having a section with an essentially conical geometry.

According to a fifth embodiment of the plasma processing system as illustrated in FIG. 10, the process chamber includes angled walls near the upper end which is surrounded by the helical coil 104. As illustrated in FIG. 10, a recombination member 702 with an essentially conical upper portion can have an end surface 704 with a protruding conical geometry if it is desirable to reduce the density of plasma, or particular ion species, near the center of the output 120 of the plasma source 114. The end surface 704 can, preferably, have a rounded tip 1112 in order to reduce local electric fields, thereby reducing the likelihood of electrical arcing in the plasma. Alternatively, the bottom surface 704 of the recombination member 702 can have an inverted conical geometry similar to that of the end 704 of the recombination member 502 of FIG. 5C.

Figure 11:
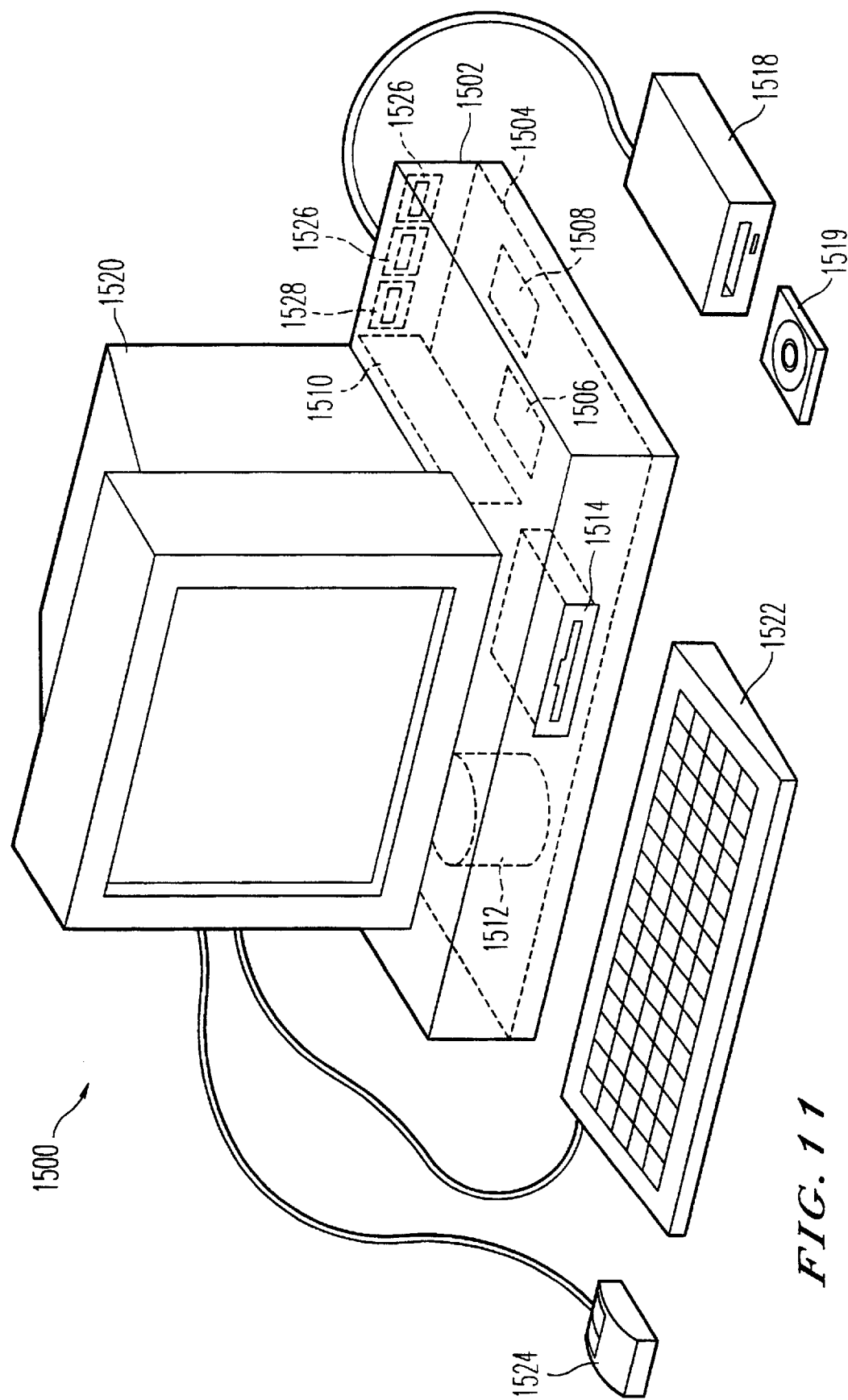
FIG. 11 is a schematic illustration of an example of a computer system for use as a monitor/controller, an external monitor, or a process controller according to the invention.

In one specific example, a monitor 530 is a computer system, illustrated schematically in FIG. 11. The computer system 1500 has a housing 1502 which houses a motherboard 1504 which contains a central processing unit (CPU) 1506, memory 1508 (e.g., DRAM, ROM, EPROM, EEPROM, SRAM and Flash RAM), and other optional special purpose logic devices (e.g., ASICs) or configurable logic devices (e.g., GAL and reprogrammable FPGA). In addition, according to the invention, the computer system contains analog-to-digital (A/D) inputs 1526 for receiving signals from one or more sensors 520. The computer also contains a communication port 1528 for communicating with a process controller. The computer 1500 further includes plural input devices, (e.g., a keyboard 1522 and mouse 1524), and a display card 1510 for controlling monitor 1520. In addition, the computer system 1500 includes a floppy disk drive 1514; other removable media devices (e.g., compact disc 1519, tape, and removable magneto-optical media (not shown)); and a hard disk 1512, or other fixed, high density media drives, connected using an appropriate device bus (e.g., a SCSI bus or an Enhanced IDE bus). Although compact disc 1519 is shown in a CD caddy, the compact disc 1519 can be inserted directly into CD-ROM drives which do not require caddies. Also connected to the same device bus or another device bus as the high density media drives, the computer 1500 may additionally include a compact disc reader 1518, a compact disc reader/writer unit (not shown) or a compact disc jukebox (not shown). In addition, a printer (not shown) also provides printed copies of important information related to the operation of the processing system, such as records of distribution of density of plasma and/or distribution of chemical composition of plasma.

The computer system further includes at least one computer readable medium. Examples of such computer readable media are compact discs 1519, hard disks 1512, floppy disks, tape, magneto-optical disks, PROMs (EPROM, EEPROM, Flash EPROM), DRAM, SRAM, etc.

Stored on any one or on a combination of the computer readable media, the present invention includes software for controlling both the hardware of the computer 1500, for enabling the computer 1500 to interact with a human user, and for controlling a plasma processing system. Such software may include, but is not limited to, device drivers, operating systems and user applications, such as development tools. Such computer readable media further includes a computer program, according to the present invention, for operating the monitor and process controller.

The computer can allow an operator to "log on" from another computer. Further, the computer may work in conjunction with other computers to control not only this particular process but other processes in a workpiece fabrication line. The computer may restrict the possible choices that the remote operator is allowed to make while performing the process, thus reducing the risk of operator error, and allowing for the employment of less-skilled operators without harming the quality control of the process.

Obviously, numerous modifications and variations of the present invention are possible in light of the above teachings. It is therefore to be understood that within the scope of the appended claims, the invention can be practiced otherwise than as specifically described herein.

What is claimed is:

1. A plasma processing system for processing substrates comprising:
    a chamber;
    a power source;
    a plasma coupling element providing power from said power source to plasma within said chamber; and
    movable means for adjusting distribution of one of density of said plasma and chemical composition of said plasma.

2. A plasma processing system as recited in claim 1, further comprising a substrate holder for holding a substrate such that said plasma causes a reaction with said substrate, wherein said movable means for adjusting adjusts distribution of one of a rate of said reaction, an amount of said reaction, stoichiometry of a film produced by said reaction, and morphology of a film produced by said reaction.

3. A plasma processing system as recited in claim 1, wherein said movable means for adjusting said distribution comprises means for adjusting an effective geometry of one of said chamber and a recombination surface proximate to said plasma.

4. A plasma processing system as recited in claim 3, further comprising a magnet.

5. A plasma processing system as recited in claim 3, wherein said movable means for adjusting an effective geometry comprises a replaceable member.

6. A plasma processing system as recited in claim 1, wherein said means for adjusting further comprises a replaceable member.

7. A plasma processing system as recited in claim 1, wherein said plasma coupling element comprises an inductive coupling element.

8. A plasma processing system as recited in claim 1, wherein said plasma coupling element comprises a helical coil, and wherein a diameter of a first portion of at least one of said chamber and said helical coil is less than a diameter of a second portion of said at least one of said chamber and said helical coil.

9. A plasma processing system as recited in claim 1, wherein said plasma coupling element comprises a helical coil, wherein a diameter of a first portion of said chamber is less than a diameter of a second portion of said chamber, wherein a diameter of a first loop of said helical coil is less than a diameter of a second loop of said helical coil, and wherein said first portion of said chamber is disposed within said first loop and said second portion of said chamber is disposed within said second loop, said system further comprising a substrate holder, wherein a distance between said substrate holder and said second portion of said chamber is less than a distance between said substrate holder and said first portion of said chamber.

10. A plasma processing system as recited in claim 1, further comprising a sensor for measuring said distribution of said one of said density and said chemical composition.

11. A plasma processing system as recited in claim 10, further comprising:
    a motor for moving said movable means for adjusting; and
    a controller for controlling said motor in response to an output of said sensor.

12. A plasma processing system as recited in claim 10, wherein said means for adjusting comprises a conductive shielding element.

13. A plasma processing system as recited in claim 1, further comprising a conductive shielding element.

14. A plasma processing system for processing substrates comprising:
    a chamber;
    a power source;
    plasma coupling element providing power from said power source to plasma, within said chamber; and
    a movable recombination member disposed proximately to said plasma, said recombination member for adjusting distribution of one of density of said plasma and chemical composition of said plasma.

15. A plasma processing system as recited in claim 14, further comprising a substrate holder for holding a substrate such that said plasma causes a reaction with said substrate, wherein said movable recombination member adjusts distribution of one of a rate of said reaction, an amount of said reaction, stoichiometry of a film produced by said reaction, and morphology of a film produced by said reaction.

16. A plasma processing system as recited in claim 14, further comprising a conductive shielding element.

17. A plasma processing system as recited in claim 14, wherein said movable recombination member comprises means for adjusting an effective geometry of one of said chamber and a recombination surface proximate to said plasma.

18. A plasma processing system as recited in claim 17, further comprising a magnet.

19. A plasma processing system as recited in claim 14, wherein said movable recombination member comprises a replaceable member.

20. A plasma processing system as recited in claim 14, wherein said plasma coupling element comprises an inductive coupling element.

21. A plasma processing system as recited in claim 14, wherein said plasma coupling element comprises a helical coil, and wherein a diameter of a first portion of at least one of said chamber and said helical coil is less than a diameter of a second portion of said at least one of said chamber and said helical coil.

22. A plasma processing system as recited in claim 14, wherein said plasma coupling element comprises a helical coil, wherein a diameter of a first portion of said chamber is less than a diameter of a second portion of said chamber, wherein a diameter of a first loop of said helical coil is less than a diameter of a second loop of said helical coil, and wherein said first portion of said chamber is disposed within said first loop and said second portion of said chamber is disposed within said second loop, said system further comprising a substrate holder, wherein a distance between said substrate holder and said second portion of said chamber is less than a distance between said substrate holder and said first portion of said chamber.

23. A plasma processing system as recited in claim 14, further comprising a sensor for measuring said distribution of said one of said density and said chemical composition.

24. A plasma processing system as recited in claim 23, further comprising:
 a motor for moving said movable recombination member; and
 a controller for controlling said motor in response to an output of said sensor.

25. A plasma processing system for processing substrates, comprising:
 a chamber;
 a power source;
 a plasma coupling element providing power from said power source to plasma within said chamber; and
 movable recombining means for recombining ions and electrons to adjust distribution of one of density of said plasma and chemical composition of said plasma.

26. A plasma processing system as recited in claim 25, further comprising a substrate holder for holding a substrate such that said plasma causes a reaction with said substrate, wherein said movable recombining means adjusts distribution of one of a rate of said reaction, an amount of said reaction, stoichiometry of a film produced by said reaction, and morphology of a film produced by said reaction.

27. A plasma processing system as recited in claim 25, further comprising a conductive shielding element.

28. A plasma processing system as recited in claim 25, wherein said movable recombining means comprises means for adjusting an effective geometry of one of said chamber and a recombination surface proximate to said plasma.

29. A plasma processing system as recited in claim 28, further comprising a magnet.

30. A plasma processing system as recited in claim 25, wherein said movable recombining means comprises a replaceable member.

31. A plasma processing system as recited in claim 25, wherein said plasma coupling comprising an inductive coupling element.

32. A plasma processing system as recited in claim 25, wherein said plasma coupling element comprises a helical coil, and wherein a diameter of a first portion of at least one of said chamber and said helical coil is less than a diameter of a second portion of said at least one of said chamber and said helical coil.

33. A plasma processing system as recited in claim 25, wherein said plasma coupling element comprises a helical coil, wherein a diameter of a first portion of said chamber is less than a diameter of a second portion of said chamber, wherein a diameter of a first loop of said helical coil is less than a diameter of a second loop of said helical coil, wherein said first portion of said chamber is disposed within said first loop and said second portion of said chamber is disposed within said second loop, said system further comprising a substrate holder, wherein a distance between said substrate holder and said second portion of said chamber is less than a distance between said substrate holder and said first portion of said chamber.

34. A plasma processing system as recited in claim 25, further comprising a sensor for measuring said distribution of said one of said density and said chemical composition.

35. A plasma processing system as recited in claim 34, further comprising:
 a motor for moving said movable recombining means; and
 a controller for controlling said motor in response to an output of said sensor.

36. A plasma processing system for processing substrates, comprising:
 a chamber;
 a power source;
 a plasma coupling element providing power from said power source to plasma within said chamber, said plasma coupling element comprising a helical coil, wherein a diameter of a first portion of at least one of said chamber and said helical coil is less than a diameter of a second portion of said at least one of said chamber and said helical coil.

37. A plasma processing system as recited in claim 36, wherein a diameter of a first portion of said chamber is less than a diameter of a second portion of said chamber, wherein a diameter of a first loop of said helical coil is less than a diameter of a second loop of said helical coil, and wherein said first portion of said chamber is disposed within said first loop and said second portion of said chamber is disposed within said second loop, said system further comprising a substrate holder, wherein a distance between said substrate holder and said second portion of said chamber is less than a distance between said substrate holder and said first portion of said chamber.

38. A plasma processing system as recited in claim 36, further comprising a conductive shielding element decoupling plasma from said power, wherein a diameter of a first portion of said conductive shielding element is less than a diameter of a second portion of said conductive shielding element.

39. A plasma processing system as recited in claim 38, further comprising a power source providing power to said conductive shielding element.

40. A method for processing substrates using plasma comprising:
   providing a chamber;
   providing a plasma coupling element;
   providing power to said plasma coupling element such that said plasma coupling element provides power to plasma within said chamber; and
   adjusting distribution of one of density of said plasma and chemical compositon of said plasma using a movable recombination member proximate to said plasma.

41. A method as recited in claim 40, further comprising using said plasma to cause a reaction with a substrate, wherein said step of adjusting distribution of one of density and chemical composition adjusts distribution of one of a rate of said reaction, an amount of said reaction, stoichiometry of a film produced by said reaction, and morphology of a film produced by said reaction.

42. A method as recited in claim 40, wherein said step of adjusting distribution of one of density and chemical composition comprises adjusting an effective geometry of one of said chamber and a recombination surface proximate to said plasma.

43. A method as recited in claim 42, further comprising providing a magnetic field proximate to said one of said chamber and said recombination surface.

44. A method as recited in claim 40, further comprising:
   replacing said movable recombination member.

45. A method as recited in claim 40, wherein said step of providing a plasma coupling element comprises providing an inductive plasma coupling element coupled to a region within said chamber.

46. A method as recited in claim 40, wherein said step of providing a plasma coupling element comprises providing a helical coil coupled to a region within said chamber, and wherein at least one of said step of providing a chamber and said step of providing a helical coil comprises providing a curved member, wherein a radius of a first portion of said curved member is less than a radius of a second portion of said curved member.

47. A method as recited in claim 40, wherein said step of providing a chamber comprises providing a chamber having first and second portions, wherein a diameter of said first portion of said chamber is less than a diameter of said second portion of said chamber, wherein said step of providing a plasma coupling element comprises providing a helical coil, wherein a diameter of a first portion of said helical coil is less than a diameter of a second portion of said helical coil, said method further comprising:
   disposing said first portion of said chamber within said first portion of said helical coil;
   disposing said second portion of said chamber within said second portion of said helical coil; and
   disposing a substrate within said chamber such that a distance between said substrate and said second portion of said chamber is less than a distance between said substrate and said first portion of said chamber.

48. A method as recited in claim 40, further comprising measuring said distribution of said one of said density and said chemical composition to provide a measurement output.

49. A method as recited in claim 48, further comprising moving said movable recombination member.

50. A method as recited in claim 49, further comprising:
   providing a motor to move said movable recombination member; and
   controlling said motor to move said movable recombination member in response to said measurement output.

51. A method as recited in claim 50, further comprising providing a conductive shielding element decoupling plasma from power.

52. A method as recited in claim 50, further comprising:
   replacing said movable recombination member with another movable recombination member.

53. A method as recited in claim 40, further comprising providing a conductive shielding element decoupling plasma from power.

54. A method as recited in claim 53, wherein said step of providing a plasma coupling element comprises providing an inductive plasma coupling element coupled to a region within said chamber.

55. A method for processing substrates using plasma comprising:
   providing a chamber;
   providing a plasma coupling element;
   providing power to said plasma coupling element such that said plasma coupling element provides power to plasma within said chamber; and
   adjusting, using a movable recombination member proximate to said plasma, an amount of recombination of ions and electrons to adjust distribution of one of density of said plasma and chemical composition of said plasma.

56. A method as recited in claim 55, further comprising using said plasma to cause a reaction with a substrate, wherein said step of adjusting an amount of recombination adjusts distribution of one of a rate of said reaction, an amount of said reaction, stoichiometry of a film produced by said reaction, and morphology of a film produced by said reaction.

57. A method as recited in claim 55, further comprising providing a conductive shielding element decoupling plasma from power.

58. A method as recited in claim 55, wherein said step of adjusting an amount of recombination comprises adjusting an effective geometry of one of said chamber and a recombination surface proximate to said plasma.

59. A method as recited in claim 58, further comprising providing a magnetic field proximate to said one of said chamber and said recombination surface.

60. A method as recited in claim 55, wherein said step of providing a plasma coupling element comprises providing an inductive plasma coupling element coupled to a region within said chamber.

61. A method as recited in claim 55, wherein said step of providing a plasma coupling element comprises providing a helical coil coupled to a region within said chamber, and wherein at least one of said step of providing a chamber and said step of providing a helical coil comprises providing a curved member, wherein a radius of a first portion of said curved member is less than a radius of a second portion of said curved member.

62. A method as recited in claim 55, wherein said step of providing a chamber comprises providing a chamber having first and second portions, wherein a diameter of said first portion of said chamber is less than a diameter of said second portion of said chamber, wherein said step of providing a plasma coupling element comprises providing a helical coil, wherein a diameter of a first portion of said helical coil is less than a diameter of a second portion of said helical coil, said method further comprising:

disposing said first portion of said chamber within said first portion of said helical coil;

disposing said second portion of said chamber within said second portion of said helical coil; and disposing a substrate within said chamber such that a distance between said substrate and said second portion of said chamber is less than a distance between said substrate and said first portion of said chamber.

63. A method as recited in claim 55, further comprising measuring said distribution of said one of said density and said chemical composition to provide a measurement output.

64. A method as recited in claim 63, further comprising moving said movable recombination member.

65. A method as recited in claim 64, further comprising:

providing a motor to move said movable recombination member; and controlling said motor to move said movable recombination member in response to said measurement output.

66. A method as recited in claim 63, wherein said step of providing a plasma coupling element comprises providing an inductive plasma coupling element coupled to a region within said chamber.

* * * * *